United States Patent [19]

Zirkl

[11] Patent Number: 4,523,103
[45] Date of Patent: Jun. 11, 1985

[54] ELECTRONIC TIME SWITCH

[75] Inventor: Siegmar Zirkl, Regensburg, Fed. Rep. of Germany

[73] Assignee: Siemens Aktiengesellschaft, Munich, Fed. Rep. of Germany

[21] Appl. No.: 522,036

[22] Filed: Aug. 9, 1983

[30] Foreign Application Priority Data

Aug. 17, 1982 [DE] Fed. Rep. of Germany ....... 3230571

[51] Int. Cl.³ ............................................. H01H 43/04
[52] U.S. Cl. .................................. 307/141; 307/592; 307/597
[58] Field of Search ............... 307/141, 252 P, 592, 307/594, 595, 597; 323/239, 242, 324, 326

[56] References Cited

U.S. PATENT DOCUMENTS

| 3,932,803 | 1/1976 | Buck | 307/252 P X |
| 4,204,128 | 5/1980 | Kruper | 307/141 |
| 4,415,943 | 11/1983 | Wortman | 307/141 X |
| 4,420,693 | 12/1983 | Becker et al. | 307/141 X |

Primary Examiner—A. D. Pellinen
Assistant Examiner—Derek S. Jennings
Attorney, Agent, or Firm—Scully, Scott, Murphy and Presser

[57] ABSTRACT

An electronic time switch for the time-limited actuation of appliances which are supplied with alternating current, whose load component is actuated by an electronic control element, and which includes terminals which supply the load component as well as the control element. A first storage element is charged during the inoperative condition through a rectifier, wherein the first storage element charges a second storage element upon initiation of load operation through the intermediary of a pushbutton with switching functions, through a recharging branch having a current limiting resistor. The recharging branch consists of a parallel circuit including an ohmic resistor and a threshold rectifier.

3 Claims, 2 Drawing Figures

ELECTRONIC TIME SWITCH

BACKGROUND OF THE INVENTION

1. Field of the Invention

The present invention relates to an electronic time switch for the time-limited actuation of appliances, such as lamps, which are supplied with alternating current, whose load component is actuated by an electronic control element, and which includes connections or terminals which supply the load component as well as the control element in that, in the inactive condition, a first storage element is charged through a rectifier which, upon initiation of the load operation through the intermediary of a pushbutton providing switching functions, charges a second storage element through a recharging branch line with a power limiting resistor.

2. Discussion of the Prior Art

A time switch of the type under consideration has already been proposed in German Pat. No. P 31 11 753.8, assigned to the common assignee of the present patent application. In the already-described time switch it is adequate to provide two connecting conductors, in contrast with the otherwise usual electronic time switches which, for the actuation of the load, as well as for the electronic control component, require their own current supply conductors, in essence, a total of more than two, and frequently four conductors. Such a time switch can thus be easily inserted into present wiring boxes in exchange with an installation switch. The operating period for a load which is to be switched in can be set in the described time switch through a timer element which is connected in parallel with the second storage element, and which consists of a fixed ohmic resistor and of a variable resistor, both connected in series. Thus, when a time switch of that type is manually actuated, then an appliance is placed into operation in the load component during a previously fixed time period.

SUMMARY OF THE INVENTION

Accordingly, it is an object of the present invention to so improve upon the previously-described time switch, in that the actuated period of a load, in the specific instance, can be individually adjusted through a differently long actuation of an operating button.

The foregoing object, as described herein, consists of in that the recharging branch line includes a parallel circuit constituted of an ohmic resistor and a threshold rectifier. With respect to the previously described time switch there is thus eliminated the variable potentiometer consisting of the fixed resistor and variable resistor, and in the recharging branch line there is arranged the parallel circuit consisting of the ohmic resistor and the threshold resistor. In the deactivated condition, there is charged the first storage element. When the pushbutton is actuated, the second storage element is then charged through the current limiting resistor and the threshold rectifier, for example, a zener diode. When the potential difference between the first and second storage elements drops below the threshold value, for a threshold rectifier in the pass direction, and the pushbutton is still pressed, there then takes place a further recharging between the first storage element to the second storage element through the resistance formed from the current limiting resistor and the ohmic resistor of the parallel circuit. In conformance with the different charging of the second storage, the time switch remains actuated for a corresponding length of time. On the other hand, with a time switch of that type it is also possible to effectuate a subsequent actuation during operation.

When the capacity of the first storage element relative to the capacity of the second storage element is in a ratio of about two to six, in practice there are then obtained favorable actuating conditions. It is particularly advantageous to select the storage capacities such that the capacity of the first storage element relative to the second storage element is in a ratio of about three to five. In a current limiting resistor which is suitably dimensioned in practice, in order to protect the contacts of the pushbutton, there are then obtained minimum actuation periods of between about ¾ of a minute and 1½ minutes in dependence upon how long the pushbutton is actuated. A larger time constant, occasioned by the second storage element or capacitor and the resistor of the parallel circuit provides for an extension of the minimum period.

BRIEF DESCRIPTION OF THE DRAWINGS

Reference may now be had to the following detailed description of an exemplary embodiment of the invention, taken in conjunction with the accompanying drawings; in which.

DETAILED DESCRIPTION

Figure 1:
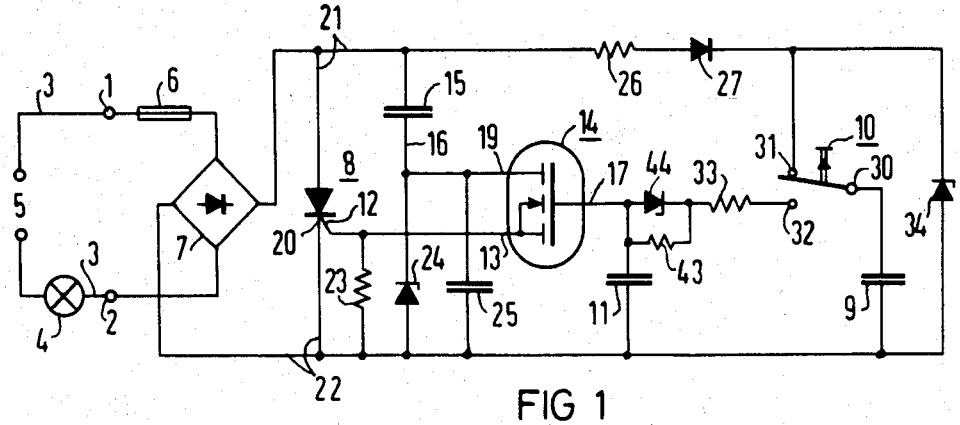
FIG. 1 illustrates a circuit block diagram representing the construction of the time switch.

The electrical components of the time switch are illustrated in FIG. 1 of the drawings. Connected to the terminals 1 and 2 are the two switch conductors 3 leading to an appliance 4 which is supplied from a power supply 5. In the illustrated embodiment, connection is made from the terminal 1 through a safety fuse 6 to a rectifier circuit 7, which in the illustrated embodiment is constructed as dual-path rectifier. The terminals 1 and 2 of the load component with a silicon-controlled rectifier (SCR) 8 concurrently supply the control element. Hereby, in the inoperative condition, a first storage element or capacitor 9 is charged through the rectifier 7, which upon initiation of the load operation will, by means of a pushbutton switch 10 having a switching function, charge a second storage element or capacitor 11. This latter capacitor then supplies the control element.

The terminals 1 and 2, in the exemplary embodiment according to FIG. 1, are connected with a rectifier. The rectifier 7 in the illustrated embodiment is embodied through a dual-path rectifier without a smoothing filter circuit. Arranged in its rectifier circuit is a silicon-controlled rectifier 8, whose control input 12 is connected with an output 13 of an electronic control element or rectifier 14. The load rectifier 8 can be constructed, in particular, as a thyristor, of which an SCR is one type. The other output of the control rectifier 14, in essence, the output which is not connected with the control input 12 of the load rectifier 8, is connected through a conductor 16 which is provided with a capacitor 15 with the first branch in the rectified circuit. The control rectifier 14 has its control input 17 connected with the second storage capacitor 11.

The second branch 22 in the rectified circuit is additionally connected with an output 20 of the load rectifier through a resistor 23 with the control input 12 thereof. Connected to this second branch 22 is further the control rectifier 14 at its output 19, and further the second storage capacitor 11 as well as the first storage capacitor 9. The storage elements 9 and 11 are constructed in the exemplary embodiment as capacitors.

In the exemplary embodiment pursuant to FIG. 1, the control element 14 is constructed as an MOS Field Effect Transistor (MOS-FET). Arranged between the second branch 22 and the output 19 of the control rectifier 14, to which there is not connected the control input 12 of the load rectifier 8, is a zener diode 24 and a parallel-connected capacitor 25. These are correlated so as to protect the MOS-FET against excessively high voltages, and to support its switching-off behavior.

The first branch 21 of the rectified circuit, in the exemplary embodiment, is connected with the pushbutton switch 10 through a resistor 26 and through a diode 27 in the conductive circuit. The resistor 26 thereby separates the load component from the control element, and the diode 27 blocks the discharge of the first storage capacitor in the actuated condition of the time switch.

In the inactive condition, the pushbutton switch 10 forms a conductive passage from the diode 27 to the first storage capacitor 9, wherein the latter is connected to a permanent contact 30. The contact 32, which in the activated condition is switched over by the contact 31 and forms a conductive circuit, is connected with the second storage capacitor 11 through a resistor 33 on the side towards the control input 17 of the control rectifier 14.

Arranged between the first branch 21 and the second branch 22 in parallel with the series circuit which is formed of the pushbutton switch 10 and the first storage capacitor 9, is a threshold element which, in the illustrated embodiment, is a zener diode 34. This serves for the purpose that the first storage capacitor 9 is charged to a predetermined voltage value and is maintained in the charged condition as long as the pushbutton switch 10 remains depressed.

Figure 2:
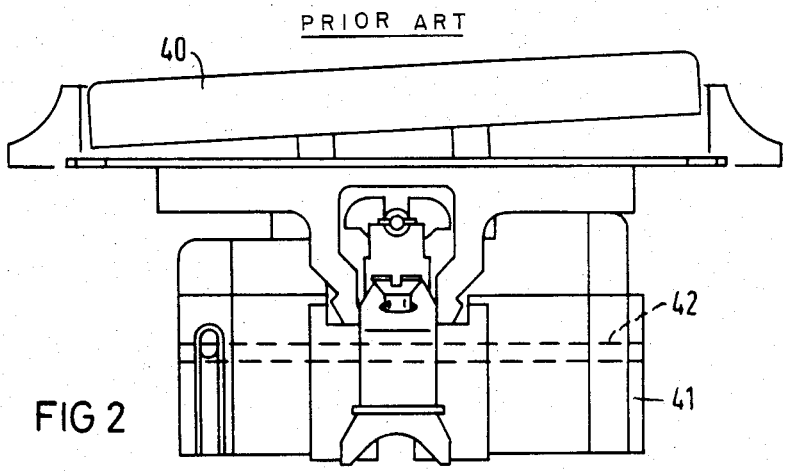
FIG. 2 illustrates a generally diagrammatic side elevational view of an installation switch, which is essentially constructed as a time switch through the incorporation of a plate having a circuit as shown in FIG. 1.

In a commercially usual installation switch pursuant to FIG. 2, whose manually actuatable element 40 is constructed as a push switch, a plate or board 42 can be arranged in a recess 41, and which takes up the components and circuit connections as illustrated in FIG. 1.

The time switch functions as follows:

In the switched-off or inactive condition, the rectifier 7 rectifies the applied voltage. The first storage capacitor 9 is charged to a voltage value through the resistor 26 and the diode 27, which corresponds to the zener breakdown voltage of the zener diode 34.

The control rectifier 14, the MOS-FET, is then blocked. Across the resistor 23, the voltage input 12 of the load rectifier 8, in the exemplary embodiment a thyristor, is at the reference potential zero. The load rectifier 8 is hereby non-conductive. When the pushbutton switch 10 is actuated, a portion of the charge of the storage capacitor 9 flows through the voltage-limiting resistor 33, which represents a contact protector, and through the threshold rectifier 44, for example, a zener diode, into the storage capacitor 11. The control rectifier 14 is then opened through the positive voltage present at the control input. Due to the waveform of the voltage which is rectified in the rectifier 7, a current flows across the capacitor 15 through the control rectifier 14 and the resistor 23. Produced hereby at the resistor 23 is a voltage drop which controls actuation of the load rectifier 8 to render the latter conductive. The time switch is now actuated and a load, for example, a lamp 4, is supplied with voltage. When the potential difference between the first storage capacitor drops below the threshold at which the threshold rectifier 44 is still conductive, then at a lengthier actuation of the pushbutton switch 10, the second storage capacitor 11 is charged further through the parallel resistor 43. Obtained hereby correspondingly lengthier actuated periods for the time switch.

When the voltage at the control input 17 of the control rectifier 14 drops below a predetermined value, the control rectifier 14 is then blocked, and the control input 12 of the load rectifier 8 is subjected to a reference potential zero. The load rectifier 12 becomes nonconductive, and the time switch is again returned into its inactive condition. A load, for example, a lamp 4, is no longer supplied since the current circuit is now interrupted.

It is possible to subsequently actuate the switched-in time switch so as to thereby extend the operating period. This is possible for so long until no adequate charge can any longer be charged over from the first storage element 9 to the second storage element 11. The time switch then will securely switch off. In the activated condition, the diode 27 serves the purpose that the first storage element 9 cannot discharge through the load rectifier 8.

When the capacity of the first storage element has a ratio of three to five relative to the capacity of the second storage element, there can be achieved at an actuated period for the pushbutton switch 10 of two seconds an approximately a switched on period of between four and five minutes, and at an actuation of six seconds a switched on period of between five and six minutes.

The safety fuse 6 protects the rectifier 7 and the load rectifier 8 from an overload and from a short-circuit.

What is claimed is:

1. An electronic time switch for time-limited actuation of appliances which are supplied with alternating current, said appliances having a load component actuated by an electronic control element, and including terminals which supply the load component and the control element; a first storage element; a second storage element; and a pushbutton, the pushbutton having a first position for charging the first storage element through a rectifier in the inoperative condition, the pushbutton having a second position wherein said first storage element charges the second storage element through a recharging branch having a current limiting resistor; the improvement comprising in that said recharging branch includes:
    a first line including a diode, the diode being in a conductive state when the pushbutton is in the second position and the magnitude of the voltage difference between the first and second storage elements exceeds a threshold value for conducting current from said first storage element to the electronic control element to actuate the electronic control element and to conduct current to the second storage element to charge the second storage element; and
    a second line electrically connected in parallel with the first line and having a resister for conducting current to the second storage element when the pushbutton is in the second position and the voltage difference between the first and second storage elements falls below the threshold value to continue conducting current from the first storage element to the electronic control element to maintain the electronic control element actuated, and to continue conducting current to the second storage element to further charge the second storage element;

whereby, the second storage element discharges current after the pushbutton is moved from the second position to the first position to maintain the electronic control element actuated for a pre-determined length of time after the pushbutton is moved to the first position, the pre-determined length of time being determined by the length of time the pushbutton is held in the second position.

2. Electronic time switch as claimed in claim 1, wherein the capacity of said first storage element has a ratio of about two to six times relative to the capacity of said second storage element.

3. Electronic time switch as claimed in claim 1, wherein the capacity of said first storage element has a ratio of about three to five times relative to the capacity of said second storage element.

* * * * *